United States Patent [19]

Dreyer et al.

[11] Patent Number: 5,763,961
[45] Date of Patent: Jun. 9, 1998

[54] ELECTRONIC SWITCHING DEVICE

[75] Inventors: Volker Dreyer, Lörrach; Bernd Strütt, Steinen, both of Germany

[73] Assignee: Endress+Hauser GmbH+Co., Maulburg, Germany

[21] Appl. No.: 716,100

[22] Filed: Sep. 19, 1996

[30] Foreign Application Priority Data

Sep. 19, 1995 [DE] Germany ............. 195 34 665.3

[51] Int. Cl.$^6$ ........................................ C02F 1/32
[52] U.S. Cl. ............... 307/116; 307/118; 307/125; 307/130; 307/141.4; 340/603; 340/612; 340/644
[58] Field of Search ............... 307/112, 116, 307/117, 118, 119, 125, 126, 127, 128–131, 139, 140, 141–141.4, 144; 340/603, 612, 626, 644

[56] References Cited

U.S. PATENT DOCUMENTS

| | | |
|---|---|---|
| 4,543,497 | 9/1985 | Buck et al. |
| 4,651,023 | 3/1987 | Parsonage ............. 307/117 |
| 4,672,230 | 6/1987 | Spähn ............. 307/116 |
| 4,859,869 | 8/1989 | Heuwinkel et al. ............. 307/117 |
| 5,256,909 | 10/1993 | Tigges et al. |
| 5,404,048 | 4/1995 | Panner ............. 307/118 |
| 5,473,202 | 12/1995 | Mudge et al. ............. 307/117 |
| 5,611,918 | 3/1997 | Markham ............. 307/117 |

FOREIGN PATENT DOCUMENTS

| | | |
|---|---|---|
| 0 092 711 | 11/1983 | European Pat. Off. |
| 31 23 828 | 2/1982 | Germany. |
| 32 14 836 | 11/1983 | Germany. |
| 40 27 386 | 11/1991 | Germany. |
| 2 078 039 | 12/1981 | United Kingdom. |

Primary Examiner—Brian Sircus
Assistant Examiner—Peter Ganjian
Attorney, Agent, or Firm—Bose McKinney & Evans

[57] ABSTRACT

The electronic switching device serves to control the connection of a load to a voltage source by a switch which is controlled in a first operating mode directly by a binary signal furnished by a signal processing circuit and in a second operating mode inverted. The switching device has three terminals, of which the first permanently remains connected to a first terminal of the voltage source and to a first terminal of the load, whilst of the other two switching device terminals the one is connected to the second terminal of the voltage source and the other to the second terminal of the load. The switching device is configured so that it can be changed over from the one operating mode into the other by interchanging the connections between these two other switching device terminals and the second terminals of the voltage source and of the load, respectively.

6 Claims, 4 Drawing Sheets

ELECTRONIC SWITCHING DEVICE

BACKGROUND OF THE INVENTION

1. Field of the Invention

The invention relates to an electronic switching device for controlling the connection of a load to a voltage source as a function of a physical variable to be monitored, comprising a sensor furnishing an output signal depending on said physical variable, a signal processing circuit connected to the sensor, this circuit furnishing a binary signal accepting the one or the other signal value, depending on whether the value of the physical variable to be monitored lies above or below a given threshold value, a switch which controls the connection between the voltage source and the load and which is opened or closed by a binary switching signal depending on the signal value of the output signal of the signal processing circuit, and further comprising a controllable inverter which depending on the signal value of a binary control signal transfers the output signal of the signal processing circuit either directly for a first operating mode or inverted for a second operating mode as a switching signal to the switch, said switching device having three switching device terminals for connecting the voltage source and the load and is configured so that it is adjustable by differingly connecting the voltage source and the load for operation in the first operating mode or for operation in the second operating mode, and the voltage source being a DC voltage source which also furnishes the supply voltage necessary for operating the switching device to a supply voltage conductor in the switching device.

2. Description of the Related Art

An electronic switching device of this kind known from DE 31 23 828 C3 is a contactless proximity switch. In such proximity switches the physical variable to be monitored is an electrical or optical variable which is influenced by the proximity of an object, material or living creature. It is fundamentally possible, however, with such an electronic switching device to monitor any physical variable whatsoever for which a sensor exists which is capable of sensing the physical variable and converting it into an electrical signal as a function of the value of the physical variable. Known examples of such physical variables are pressure, temperature, moisture content, material level etc. The switching device is required to be able to work, as selected, in the one or the other of the two operating modes: in the one operating mode it is required to connect the load to the voltage source when the value of the physical variable to be monitored exceeds a given maximum value, and in the other operating mode it is to connect the load to the voltage source when the value of the physical variable to be monitored falls below a given minimum value. It is required that the switching device permits setting in the one or other operating mode without any change to its structure and without requiring access to its internal circuitry, simply by differingly connecting the voltage source and the load to the terminals of the switching device.

In the switching device described in DE 31 23 828 C3 the voltage source is connected between a first and a second switching device terminal and the load remains connected to one pole of the voltage source, on the one hand, and to the third switching device terminal, on the other. The control input of the controllable inverter, formed by an exclusive OR circuit, is directly connected to the second switching device terminal, so that the voltage of the voltage source connected to this switching device terminal forms the binary control signal and the changeover between the two operating modes is done by changing the polarity of the voltage source between the first and second switching device terminal. So that, despite this change in polarity, the signal value necessary for operating the switching device always has the same polarity, this signal value is taken from a rectifier bridge connected between the first and second switching device terminal. It is thus not possible that switching device, voltage source and load simultaneously have a common reference potential, for example ground potential.

In an electronic switching device of a similar kind known from DE 32 14 836 C2, in which however the voltage source is an AC voltage source, the load is in series with the voltage source and setting the switching device to the one or the other operating mode is done by the series circuit arrangement of load and voltage source being connected either between the first and second switching device terminal or between the first and third switching device terminal, whilst the other switching device terminal remains free in each case. The DC voltage necessary for operating the switching device is generated by a rectifier bridge which contains a separate half bridge for each switching device terminal. The binary control signal for the controllable inverter is taken via a diode from the third switching device terminal. The series circuit arrangement of load and voltage source employed in the case of this switching device results in just the same way in switching device, voltage source and load being unable to all have simultaneously a common reference potential, for example ground potential.

SUMMARY OF THE INVENTION

It is the object of the invention to provide a switching device of the stated kind which with a simple configuration is capable of being set in the one or other operating mode by differingly connecting load and voltage source so that in each operating mode switching device, voltage source and load are able to have a common reference potential.

According to the invention this object is achieved in that a first terminal of the voltage source and a first terminal of the load are connected to a common first switching device terminal, that each second and third switching device terminal is connected via a diode to the supply voltage conductor in the switching device, that the one side of the switch is connected to the supply voltage conductor and the other side of the switch is connected via a diode to the second and third switching device terminal in each case, that the switching device contains a memory for binary information which receives at a first signal input the switching signal furnished by the controllable inverter and a changeover signal depending on the voltage between the first and second switching device terminal at a second signal input, and at the output thereof furnishes the binary control signal for the controllable inverter, the signal value of which depends on the binary information held in the memory, that the memory is configured such that it stores a binary information determined by the value of the changeover signal when the switching signal has the signal value at which the switch is open, and retains the binary information held before, when the switching signal has the value at which the switch is closed, and that for setting one of the two operating modes the second terminal of the voltage source is connected to the second switching device terminal and the second terminal of the load is connected to the third switching device terminal and for setting the other operating mode these two connections are interchanged.

In the switching device according to the invention the voltage source and the load are each connected by one of their terminals permanently to a common switching device terminal which may have a fixed reference potential. This reference potential is preferably ground potential, this resulting in the advantage that the device is insensitive to high-frequency noise which flows off via ground. The other terminals of the voltage source and load are each connected independently of each other to one of the two other switching device terminals and setting the device to the one or the other operating mode is done by simply interchanging these two connections. The memory contained in the switching device recognizes the nature of the connection and stores a corresponding binary information which sets the control signal furnished by the inverter so that the inverter works in the operating mode corresponding to the nature of the connection.

When the DC voltage furnished by the voltage source has a value which is directly suitable for the changeover signal furnished to the memory, the changeover signal may be directly taken from the second switching device terminal. If this voltage value is too high, one advantageous embodiment of the invention consists of a voltage divider being connected between the first and second switching device terminal, from which the changeover signal is taken. In this case, the voltage divider is preferably formed by a resistor and a Zener diode connected in series.

BRIEF DESCRIPTION OF THE DRAWINGS

Further features and advantages of the invention will be evident from the following description of the example embodiments as illustrated in the drawings in which.

DESCRIPTION OF THE PREFERRED EMBODIMENTS

Figure 1:
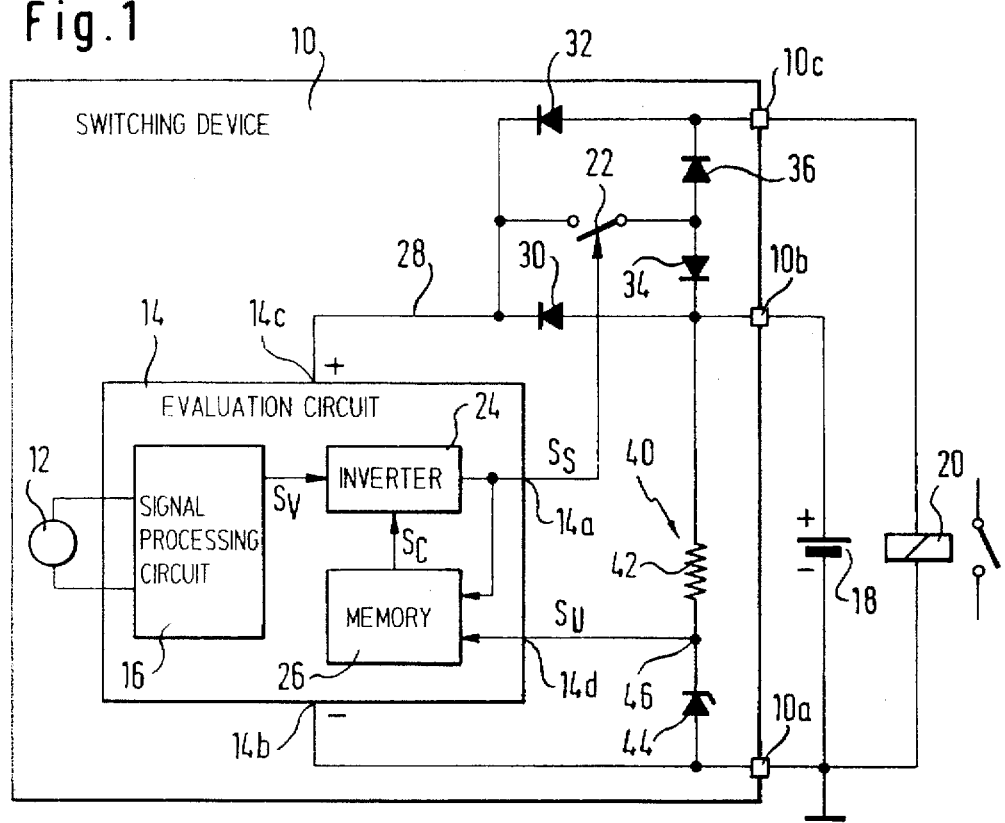
FIG. 1 is a circuit diagram of a first embodiment of an electronic switching device in accordance with the invention configured as a level limit switch in the mode for monitoring a maximum level.

The electronic switching device illustrated in FIG. 1 of the drawing serves to trigger a switching action as a function of a physical variable to be monitored. It contains for this purpose a sensor 12 sensitive to the physical variable to be monitored and furnishes an electrical signal characteristic of this physical variable, and an evaluation circuit 14 which on the basis of the electrical signal furnished by the sensor 12 generates a switching signal $S_S$ which triggers the switching action and is delivered at output 14a. The evaluation circuit 14 has two further terminals 14b, 14c for the necessary operating voltage and an input 14d for a changeover signal $S_u$, the purpose of which is explained further below.

Known examples of switching devices of this kind are the so-called proximity switches, the sensors of which respond, preferably contactlessly, to the physical presence of a living creature, an object or a material in the surroundings. The sensor 12 may, however, also be sensitive to pressure, temperature, moisture or any other physical variable whatsoever, resulting in the switching device triggering a switching action when the physical variable being monitored attains a predetermined value. For this purpose any sensor is suitable which is capable of generating or influencing an electrical signal as a function of the variable being monitored. Numerous such sensors are known, for example, inductive, capacitive, resistive, piezoelectric and other sensors.

For a better appreciation it is assumed in the following description that the switching device is a so-called level limit switch which triggers a switching action as a function of whether or not a predetermined level in a container is exceeded or fallen short of. The sensor 12 is thus a level sensor responding to whether material filled into a container exists at the level being monitored or not. A variety of such level sensors is known suitable for this purpose, for example capacitive sensors, the capacitance of which changes as a function of whether they are covered by the material or not, vibrating sensors, the amplitude or frequency of the vibrations of which changes as a function of whether they are covered by the material or not, and so on. A signal processing circuit 16 contained in the evaluation circuit 14 and connected to the sensor 12 is configured according to the nature of the sensor used so that it furnishes at its output a signal $S_V$ which has a first value when the sensor detects that material exists at the level being monitored, and which has a second value when the sensor 12 detects that no material exists at the level being monitored.

The switching device 10 has three switching device terminals 10a, 10b and 10c accessible from without. These switching device terminals serve to connect an external voltage source 18 and an external load 20. The external voltage source 18 is a DC voltage source which supplies the necessary operating voltage to the switching device 10. The external load 20 is supplied with current from the voltage source 18 depending on the switching condition of the switching device 10. As an example illustrated in the drawing, the load 20 is a relay which is energized or non-energized depending on the switching condition of the switching device 10. A switch 22 contained in the switching device 10, which is actuated by the switching signal $S_S$ delivered from output 14a of the evaluation circuit 14, controls the current supply to the load 20. This switch 22 is open when the switching signal $S_S$ has the one signal value, for instance the value 0, and it is closed when the switching signal $S_S$ has the other signal value, i.e. the value 1 in the selected example. The switch 22 is represented symbolically as a mechanical switching contact; in reality what is involved is a fast electronic switch, for example a bipolar transistor, a field-effect transistor or a thyristor.

If the switching device 10 is to be employed as a level limit switch for monitoring a maximum level, it is required that the relay 20 be energized when the maximum level is attained, and it should de-energize again when the level of the material in the container has returned below the maximum level. Accordingly, the relay 20 is to be energized when the signal $S_V$ delivered by the signal processing circuit 16 has the value indicating that the sensor 12 detects the presence of material. If, on the other hand, the switching device 10 is to be employed as a level limit switch for monitoring a minimum level, it is required that the relay 20 be energized when the signal $S_V$ delivered by the signal processing circuit 16 has the value indicating that the sensor 12 detects no presence of material at the level being monitored. So that one and the same switching device 10 may be put to use for these two differing operating modes, without needing to be changed in structure, it needs to permit changing over by the user in situ. The sole access possibility the user has to the switching device consists of the switching device terminals 10a, 10b, 10c. Thus, the switching device 10 is configured so that it is programmable by differingly connecting the voltage source 18 and the load 20 to the switching device terminals 10a, 10b and 10c such that it operates selectively in the one or other operating mode.

For this purpose the evaluation circuit 14 includes a controllable inverter 24 which receives at its signal input the output signal $S_V$ of the signal processing circuit 16 and delivers at its output the switching signal $S_S$. The controllable inverter 24 includes further a control input which is connected to the output of a memory 26 from which is receives a control signal $S_C$ which determines whether the inverter is to transfer the signal $S_V$ directly, i.e. without being inverted, as the switching signal $S_S$ or whether it is required to invert the signal $S_V$ so that the switching signal $S_S$ is always complementary to the signal $S_V$.

The switching device terminal 10a is directly connected to the one supply voltage terminal 14b of the evaluation circuit 14 which in the case illustrated is the terminal for the negative pole of the supply voltage. The supply voltage conductor 28 leading to terminal 14c for the positive pole of the supply voltage is connected via a diode 30 to the switching device terminal 10b and via a diode 32 to the switching device terminal 10c. The diodes 30 and 32 are polarized so that they are ON in the direction from the switching device terminals 10b and 10c, respectively, to the supply voltage conductor 28 and are OFF in the other direction. Also connected to the supply voltage conductor 28 is the one end of the switch 22, the other end of which is connected via a diode 34 to the switching device terminal 10b and via a diode 36 to the switching device terminal 10c. The diodes 34 and 36 are polarized so that they are ON in the direction from the switch 22 to the switching device terminals 10b and 10c, respectively, and are OFF in the other direction. Between the switching device terminals 10b and 10a a voltage divider 40 is connected which is formed by a resistor 42 in series with a Zener diode 44. The tap 46 of the voltage divider 40 is connected via the terminal 14d of the evaluation circuit 14 to an input of the memory 26, it furnishing to this input the changeover signal $S_U$. A further input of the memory 26 receives the switching signal $S_S$ from the output of the inverter 24. The memory 26 serves to store a binary information as determined by the signals $S_S$ and $S_U$ and in turn determines the signal value of the control signal $S_C$.

FIG. 1 shows the circuit arrangement of the switching device 10 for the case in which it is employed for monitoring a maximum level, it being assumed that in this case no inverting of the switching signal $S_S$ takes place in the inverter 24. The voltage source 18 is connected between the switching device terminals 10a and 10b and the load 20 between the switching device terminals 10a and 10c. For a better appreciation, FIG. 2 shows an equivalent circuit diagram of the switching device 10 in this circuit arrangement, the ON diodes being represented by full-length conductors and the OFF diodes being omitted.

Figure 2:
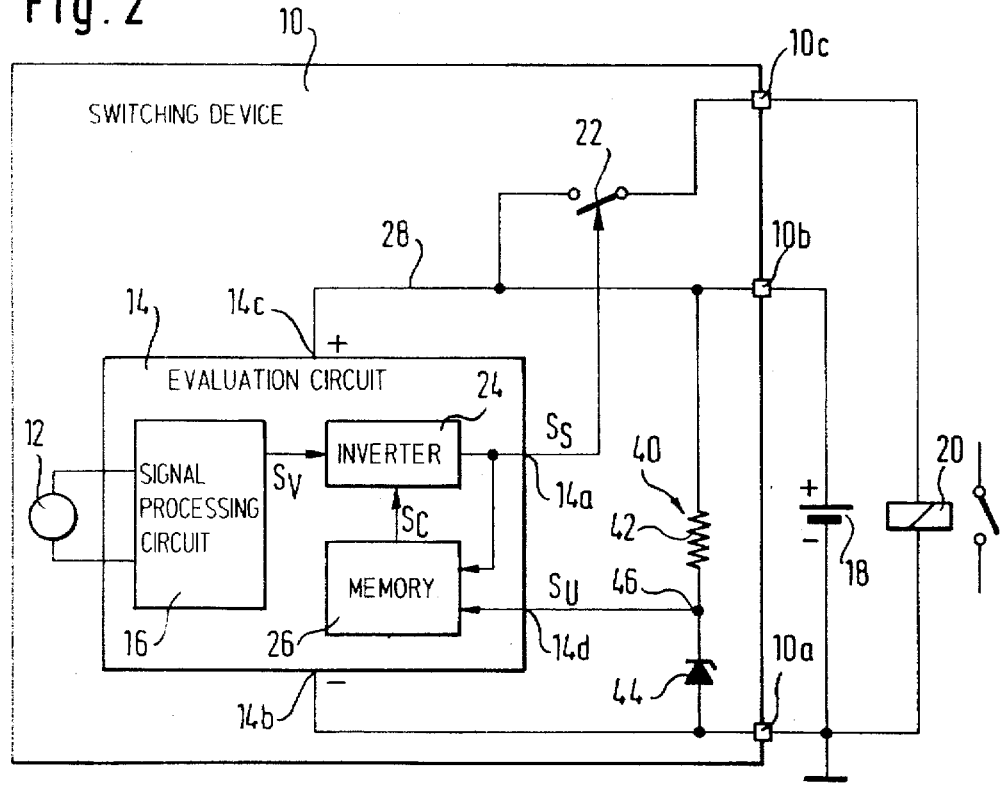
FIG. 2 is a simplified equivalent circuit diagram of the first embodiment of the electronic switching device in the operating mode of FIG. 1.
Figure 3:
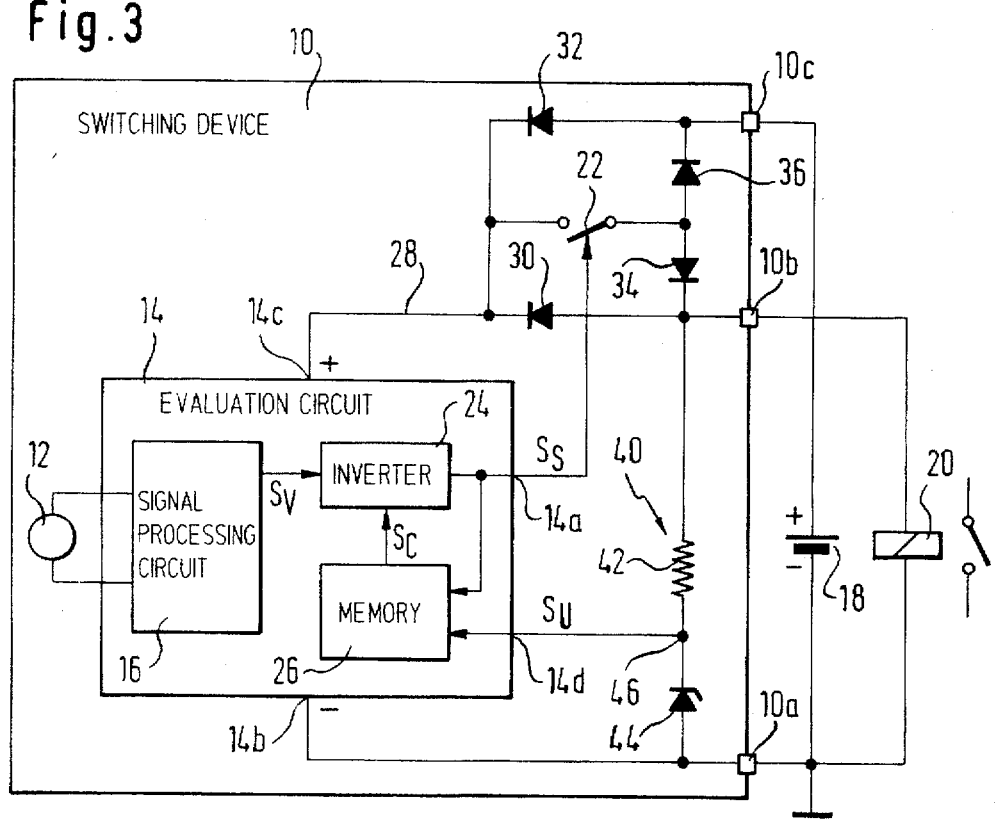
FIG. 3 is the circuit diagram of the first embodiment of the switching device configured as a level limit switch in the operating mode for monitoring a minimum level.
Figure 4:
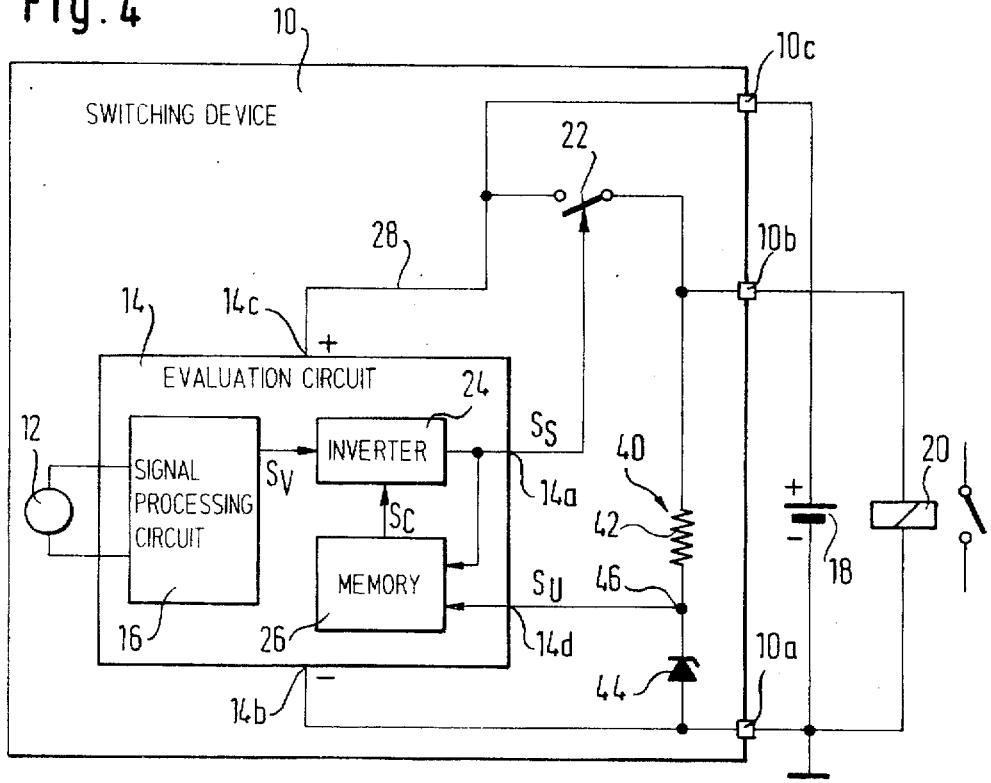
FIG. 4 is a simplified equivalent circuit diagram of the first embodiment of the electronic switching device in the operating mode of FIG. 3.

FIG. 3 shows the circuit arrangement of the switching device 10 for the case in which it is employed for monitoring a minimum level, this being the reason why the switching signal $S_S$ needs to be inverted in inverter 24, and FIG. 4 shows the corresponding equivalent circuit diagram. The difference as compared to the circuit arrangement of FIGS. 1 and 2 is that the voltage source 18 is connected between the switching device terminals 10a and 10c, whilst the load 20 is connected between the switching device terminals 10a and 10b. In both cases the voltage source 18 and the load 20 remain connected to the common switching device terminal boa which at the same time is at ground potential; the changeover between maximum value monitoring and minimum value monitoring is done in that the connections to the two other switching device terminals 10b and 10c are interchanged.

As is particularly evident from FIGS. 2 and 4 in both cases the switch 22 when closed places the voltage of the voltage source 18 on the load 20 whilst when open it open-circuits the current circuit to the load 20. There is, however, a difference as regards generation of the changeover signal $S_U$: in the case of FIGS. 1 and 2 the voltage of the voltage source 18 is continuously applied to the voltage divider 40 so that the changeover signal $S_U$ always has a voltage value different from ground potential, irrespective of whether the switch 22 is open or closed and of the value of the switching signal $S_S$; whereas in the case of FIGS. 3 and 4 the voltage of the voltage source 18 is applied only to the voltage divider 40 when the switch 22 is closed. This difference is made use of to set the binary information held in the memory 26 so that the control signal $S_C$ sent to the inverter 24 in each case has the signal value resulting in the signal $S_V$ not being inverted in the inverter 24 in the case of the circuit arrangement according to FIGS. 1 and 2, but being inverted in the case of the circuit arrangement shown in FIGS. 3 and 4.

When the following convention is made for the signal values of the signals $S_S$, $S_U$ and $S_C$:

$S_S$=0: switch 22 open;

$S_S$=1: switch 22 closed $S_U$=0: ground potential;

$S_U$=1: other potential $S_C$=0: inversion;

$S_C$=1: no inversion then the binary information held in the memory 26 and thus the signal $S_C$ is set according to the following assignment table:

| $S_S$: | 0 | 1 | 0 | 1 |
|---|---|---|---|---|
| $S_U$: | 0 | 0 | 1 | 1 |
| $S_C$: | 0 | x | 1 | x | the letter x meaning that the binary information stored in the memory 26 is not changed. In other words, a change in the binary information stored is only made when the switching signal $S_S$ has the value 0; the memory 26 is then set so that the control signal $S_C$ assumes the same value as the changeover signal $S_U$ if it does not already have this value. If the switching signal $S_S$ has the value 1, however, no change occurs to the binary information held in the memory 26, irrespective of the value of the changeover signal $S_U$.

The condition that both the signals $S_S$ and $S_U$ have the value 0 occurs only in the circuit arrangement as shown in FIGS. 3 and 4. In this circuit arrangement, this is due to the fact that the binary information held in the memory 26 is set so that the signal $S_C$ always has the value 0 and thus the signal $S_V$ is always inverted. This corresponds to monitoring a minimum level. The memory 26 retains this condition until the circuit arrangement is altered, i.e. changed to the condition shown in FIGS. 1 and 2. Then, the changeover signal $S_U$ continually has the signal value 1 and the binary information held in the memory 26 is set so that also the signal $S_C$ assumes the value 1, resulting in no inversion of the signal $S_V$ occuring in the controllable inverter 24.

In this way the same switching device 10 can be used selectively for maximum value monitoring or minimum value monitoring without any change to the structure, the desired function in each case being determined in situ by the nature of the circuit connections made to the switching device terminals 10b and 10c.

Setting the binary information in the memory 26 determining the control signal $S_C$ is done both when interchanging the terminals of the voltage source and load and every time the device is powered up and following each power failure. In each of these cases a power loss exists in the electronic circuitry for a certain time, resulting in the switch 22 being opened. On return of power there thus always exists a condition which reliably allows the circuit connections to the switching device terminals to be sensed so that the correct setting of the control signal $S_C$ is assured.

The evaluation circuit 14 and its components can be achieved by any person skilled in the art on the basis of the above description of how it functions without any further details needing to be explained. If the evaluation circuit 14 is structured by discrete electronic components the controllable inverter 24 may be formed, for example, by an exclusive OR circuit which has the known property of a binary signal applied to one input being inverted or not inverted depending on the binary value of the other binary signal applied to the other input. In this case the memory 26 may be formed by a single-stage register, for instance in the form of a flip-flop. In keeping with more advanced techniques, however, the evaluation circuit 14 may also be achieved by a suitably programmed microprocessor; in this case the functions of the controllable inverter 24 and the memory 26 are achieved by corresponding programming.

The voltage divider 40 has the purpose of stepping down the voltage of the voltage source 18 to the value required by the changeover signal $S_U$ for proper signalling of the memory 26. It can thus be eliminated when the voltage of the voltage source corresponds to this value; in this case the changeover signal $S_U$ may be taken directly from the switching device terminal 10b.

The second embodiment of the invention illustrated in FIGS. 5 to 8 differs from the first embodiment shown in FIGS. 1 to 4 merely by a second voltage divider 50 being added which is connected between the switching device terminals 10c and 10a. This second voltage divider is formed of a resistor 52 in series with a Zener diode 54 the same as the first voltage divider 40. The tap 56 of the voltage divider 50 is connected via a further terminal 14e of the evaluation circuit 14 to a further input of the memory 26. The signal taken from the tap 56 and applied to the memory 26 is termed the auxiliary signal $S_H$.

The remaining components of the second embodiment of the electronic switching device are identical to those of the first embodiment and thus connotated by the same reference numerals, these not being again explained. It is furthermore evident that the illustrations in the FIGS. 5 to 8 differ in each case from those in FIGS. 1 to 4 merely by the addition of the voltage divider 50.

The voltage divider 50 serves to additionally check whether the user has bypassed the switching device by a short-circuit between the switching device terminals 10b and 10c. If this is the case the changeover signal $S_U$ would always have the value 1, even when the switching signal $S_S$ has the value 0 and thus the switch 22 is open, irrespective of the circuit arrangement of the switching device terminals 10b and 10c. In this case no setting of the binary information held in the memory 26 to the value of the changeover signal $S_U$ is allowed.

The auxiliary signal $S_H$ allows this prohibited condition to be recognized. When the same conventions are applied to the signal values of the auxiliary signal $S_H$ as for the signal values of the changeover signal $S_U$, i.e.

Figure 6:
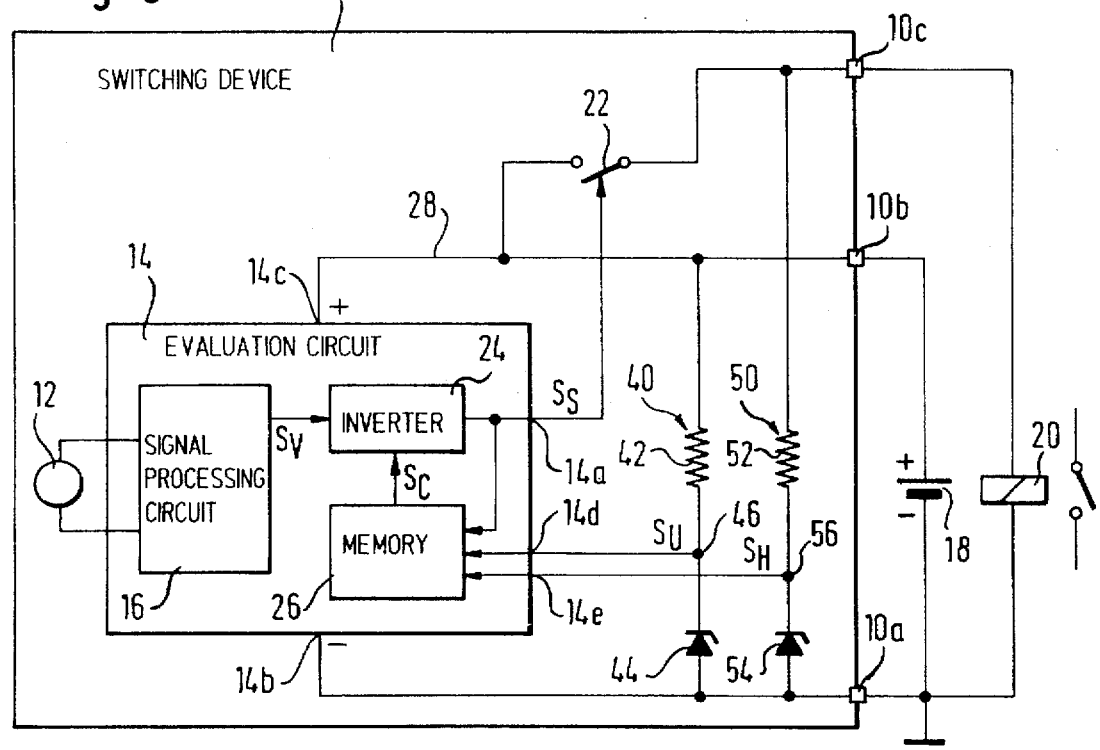
FIG. 6 is a simplified equivalent circuit diagram of the second embodiment of the electronic switching device in the operating mode of FIG. 5.
Figure 7:
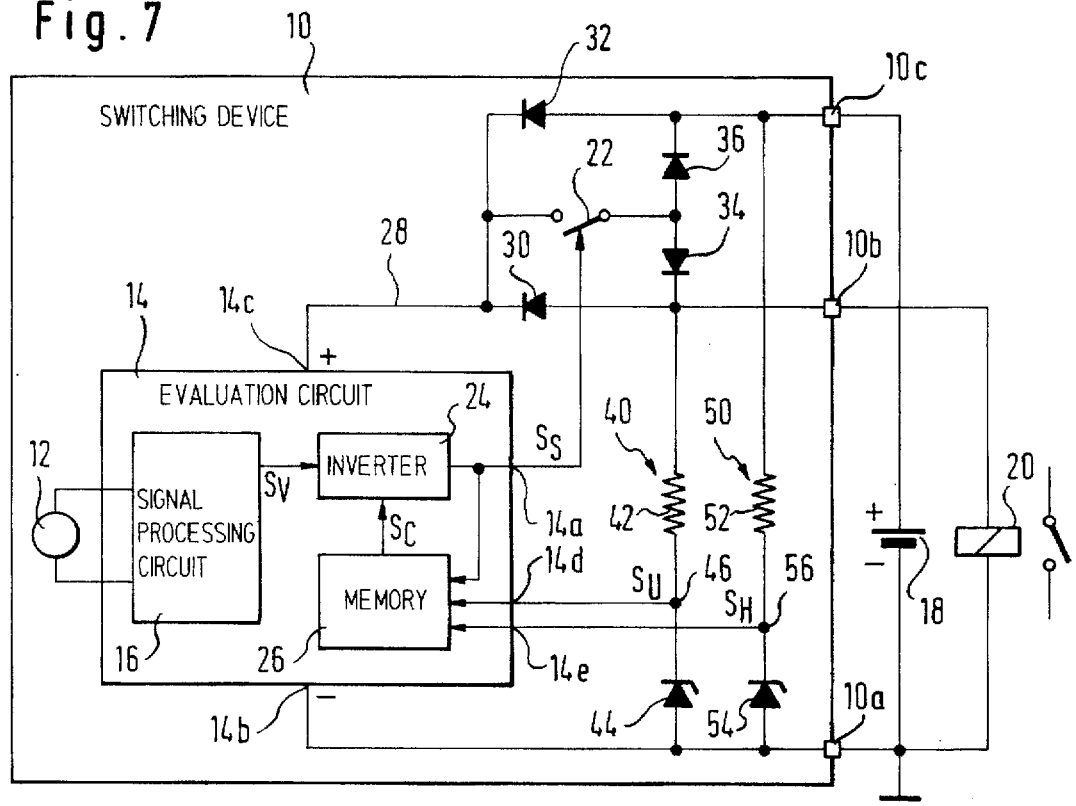
FIG. 7 is the circuit diagram of the second embodiment of the switching device configured as a level limit switch in the operating mode for monitoring a minimum level and FIG. 8 is a simplified equivalent circuit diagram of the second embodiment of the electronic switching device in the operating mode of FIG. 7.
Figure 8:
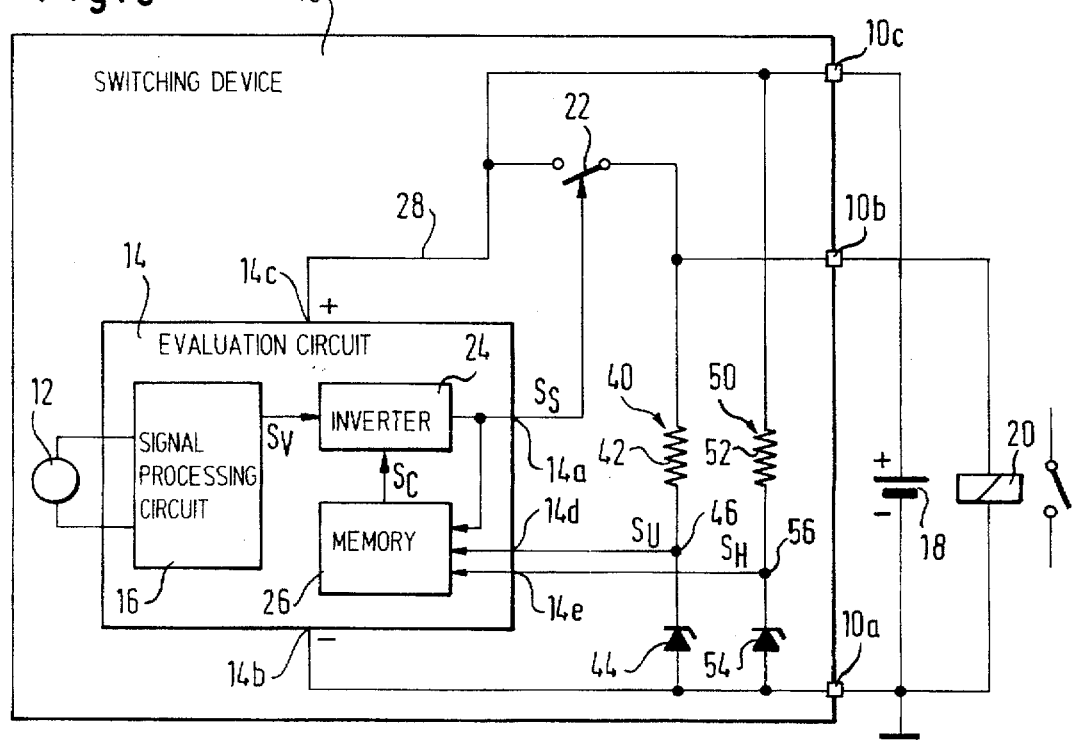

$S_H=0$: ground potential;

$S_H=1$: other potential, then it is directly evident from the FIGS. 6 and 8 that: when the switching signal $S_S$ has the value 0, the signals SU and $S_H$ can then only have the value 1 at the same time when either the switching device terminals 10b and 10c are short-circuited or the switch 22 is defective and has not opened.

Thus, when the evaluation circuit 14 detects that the signals $S_U$ and $S_H$ have the value 1 at the same time, whilst the switching signal $S_S$ has the value 0, then setting the binary information held in the memory 26 is prevented.

Since the memory 26 is now controlled by three binary signals, eight different signal conditions exist according to the following table:

|       | a | b | c | d | e | f | g | h |
|-------|---|---|---|---|---|---|---|---|
| $S_S$ | 1 | 0 | 1 | 0 | 1 | 0 | 1 | 0 |
| $S_U$ | 1 | 1 | 0 | 0 | 1 | 1 | 0 | 0 |
| $S_H$ | 1 | 1 | 1 | 1 | 0 | 0 | 0 | 0 |
| $S_C$ | X | X | X | 0 | x | 1 | — | — | the letter x again signifies that the binary information stored in the memory is not changed.

The cases g and h are irrelevant, since they signify that no voltage source is connected.

Figure 5:
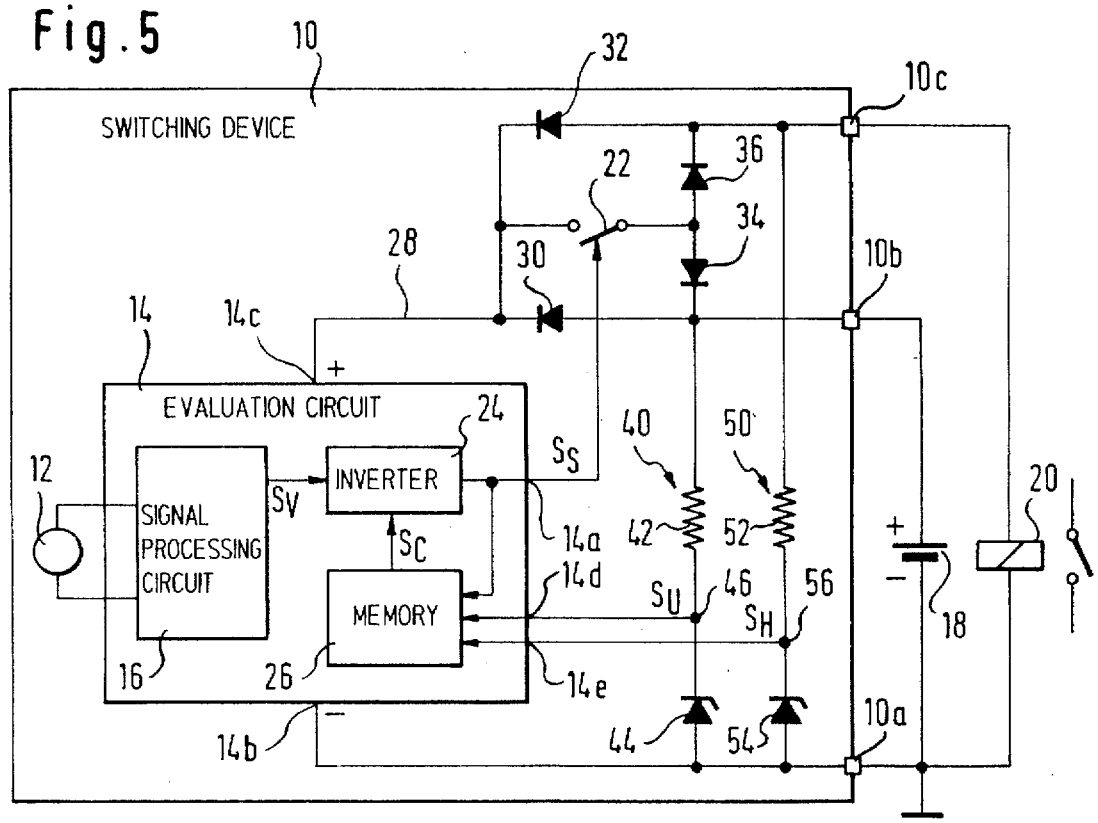
FIG. 5 is a circuit diagram of a second embodiment of an electronic switching device in accordance with the invention configured as a level limit switch in the mode for monitoring a maximum level.

The cases c, d, e, f correspond to the four cases as cited previously for the first example embodiment. In these cases the auxiliary signal $S_H$ remains ineffective since it always has the value opposed to that of the changeover signal $S_U$. Thus, in the cases d and f in which the switching signal $S_S$ has the value 0 the binary information held in the memory 26 is set such that the control signal $S_C$ assumes the same value as the changeover signal $S_U$, the case d existing only when the voltage source is connected between the switching device terminals 10a and 10c (FIGS. 7 and 8) and the case f only when the voltage source is connected between the switching device terminals 10a and 10b (FIG. 5 and 6).

The critical case is case b: this case can only occur when a short-circuit exists between the switching device terminals 10b and 10c or the switch is defective and does not open. In this case the fact that the signals $S_U$ and $S_H$ both have the same value 1, prevents a change in the binary information held in the memory 26.

In case a, too, the signals $S_U$ and $S_H$ both have the value 1, which, however is immaterial, since in this case a change in the binary information stored in the memory 26 is already prevented by the switching signal $S_S$ having the value 1.

What is claimed is:

1. An electronic switching device for controlling the connection of a load to a DC voltage source depending on a physical variable being monitored, said DC voltage source having a first terminal and a second terminal and said load having a first terminal and a second terminal;

said electronic switching device comprising:
- a supply voltage conductor for supplying a supply voltage from the DC voltage source to said electronic switching device,
- a sensor monitoring said physical variable and furnishing an output signal dependent on said physical variable,
- a signal processing circuit connected to said sensor, said signal processing circuit furnishing a binary output signal having a first signal value if the physical variable being monitored lies above a given threshold value, and a second signal value if the physical variable being monitored lies below said given threshold value,
- a switch having two sides, said switch controling the connection between said voltage source and said load,
- a controllable inverter having an input for receiving said binary output signal from said signal processing circuit and an output furnishing a switching signal which is noninverted in a first operating mode of said controllable inverter and inverted in a second operating mode of said controllable inverter, said switching signal having a first value opening said switch and a second value closing said switch,
- three switching device terminals for connecting said DC voltage source and said load, said first terminal of said DC voltage source and said first terminal of said load being connected to a common first switching device terminal, a second switching device terminal being connected via a first diode to said supply voltage conductor, and a third switching device terminal being connected via a second diode to said supply voltage conductor, one side of said switch being connected to said supply voltage conductor and the other side of said switch being connected to both the second switching device terminal via a third diode and the third switching device terminal via a fourth diode,
- a memory for storing binary information, said memory having a first signal input for receiving said switching signal furnished by said controllable inverter, a second signal input for receiving a changeover signal having a value dependent upon a voltage between said first and second switching device terminals, and an output furnishing a binary control signal to said controllable inverter, said binary control signal controlling whether the controllable inverter operates in one of said first operating mode and said second operating mode, said binary control signal having a signal value depending on binary information stored in said memory, said memory being configured such that said binary information is changed to the value of said changeover signal when said switching signal has said first value, and said binary information is not changed when said switching signal has said second value, wherein for setting one of said first operating mode and said second operating mode said second terminal of said voltage source is connected to said second switching device terminal and said second terminal of said load is connected to said third switching device terminal, and for setting the other of said first operating mode and said second operating mode these two connections are interchanged.

2. The switching device as set forth in claim 1, wherein between said first and second switching device terminals a voltage divider is connected, said voltage divider having a tap from which said changeover signal is taken.

3. The switching device as set forth in claim 2, wherein said voltage divider is formed by a resistor and a Zener diode connected in series.

4. The switching device as set forth in claim 1, wherein said memory receives at a third signal input an auxiliary signal dependent on a voltage between said first and said third switching device terminals, change of the binary information in said memory being prevented when said auxiliary signal has a value the same as said value of said changeover signal.

5. The switching device as set forth in claim 4, wherein said voltage divider is formed by a resistor and a Zener diode connected in series.

6. The switching device as set forth in claim 1, wherein said common first switching device terminal is at a fixed reference potential.

* * * * *